(12) United States Patent
Rouxel (10) Patent No.: US 7,512,868 B2
(45) Date of Patent: Mar. 31, 2009

(54) METHOD FOR PROCESSING A SIGNAL USING AN APPROXIMATE MAP ALGORITHM AND CORRESPONDING USES

(75) Inventor: Alexandre Rouxel, Rennes (FR)

(73) Assignee: Wavecom, Issy-les-moulineaux (FR)

( * ) Notice: Subject to any disclaimer, the term of this patent is extended or adjusted under 35 U.S.C. 154(b) by 591 days.

(21) Appl. No.: 10/506,521

(22) PCT Filed: Mar. 3, 2003

(86) PCT No.: PCT/FR03/00679

§ 371 (c)(1),
(2), (4) Date: Mar. 14, 2005

(87) PCT Pub. No.: WO03/075468

PCT Pub. Date: Sep. 12, 2003

(65) Prior Publication Data

US 2005/0198551 A1 Sep. 8, 2005

(30) Foreign Application Priority Data

Mar. 4, 2002 (FR) .................................. 02 02722

(51) Int. Cl.
*H03M 13/03* (2006.01)
(52) U.S. Cl. .................... 714/794; 714/798; 714/806
(58) Field of Classification Search .............. 714/794, 714/795, 798, 800, 806, 786, 755; 375/341
See application file for complete search history.

(56) References Cited

U.S. PATENT DOCUMENTS 5,315,538 A * 5/1994 Borrell et al. ............... 702/189

| 6,192,501 B1 * | 2/2001 | Hladik et al. | 714/786 |
| 6,807,239 B2 * | 10/2004 | Sugimoto et al. | 375/341 |
| 6,873,665 B2 * | 3/2005 | Kobayashi et al. | 375/341 |
| 7,246,295 B2 * | 7/2007 | Xu | 714/755 |

OTHER PUBLICATIONS

Bahl L.R. et al., "Optimal Decoding of Linear Codes for Minimizing Symbol Error Rate", IEEE Transactions on Information Theory, Mar. 1, 1974, vol. IT-20, No. 2 pp. 284-287.

(Continued)

*Primary Examiner*—Jacques H Louis-Jacques
*Assistant Examiner*—Fritz Alphonse
(74) *Attorney, Agent, or Firm*—Westman, Champlin & Kelly, P.A.

(57) ABSTRACT

The invention concerns a method for processing a signal using an approximate MAP (maximum a posteriori) algorithm for determining a likelihood ratio $\Lambda_k^X$ of a set of states X of a lattice at a time k, with each of said states being associated at least one intermediate variable belonging to a group comprising a so-called forward variable and a so-called backward variable, propagated by said MAP algorithm and recursively calculated respectively in a direct orientation and in an indirect orientation at said time k relative to said lattice. The invention is characterized in that said process comprises a step which consists in reducing the number of selected states by said MAP algorithm so as to calculate said likelihood ratio, and, for at least some unselected states, in assigning to said forward variable and/or said backward variable at least one specific value, to calculate an approximate likelihood ratio.

25 Claims, 4 Drawing Sheets

OTHER PUBLICATIONS

P. Robertson, E. Villebrun & P. Hoeher, "A Comparison of Optimal and Sub-Optimal MAP Decoding Algorithms Operating in the Log Domain", IEEE Communications-Gateway to Globalization Conference, Jun. 18, 1995, vol. 2, pp. 1009-1013.

S. Benedetto, D Divsalar, G. Montorsi & F. Pollara, "Soft-Output Decoding Algorithms for Continuous Decoding of Parallel Concatenated Convolutional Codes", IEEE International Conference on Communications (ICC), Jun. 23, 1996, vol. 1, pp. 112-117.

J. Peterson, (foreign German article) "Implementierungsapekte zur Symbol-by-Symbol MAP-Decodierung von Faltungscodes", Jan. 1, 1994, vol. NR 130, pp. 41-48.

Tor M. Aulin, "Breadth-First Maximum Likelihood Sequence Detection: Basics", IEEE Transactions on Communications, Feb. 1999, vol. 47, No. 2, pp. 208-216.

J. Anderson, "Sequential Coding Algorithms: A Survey and Cost Analysis", IEEE Transactions on Communications, Feb. 1984, vol. Com-32., No. 2, pp. 169-176.

\* cited by examiner

METHOD FOR PROCESSING A SIGNAL USING AN APPROXIMATE MAP ALGORITHM AND CORRESPONDING USES

CROSS-REFERENCE TO RELATED APPLICATION

This Application is a Section 371 National Stage Application of International Application No. PCT/FR2003/000679, filed Mar. 3, 2003 and published as WO 03/075468 A2 on Sep. 12, 2003, not in English, which is based on French application No. FR 02/02722, filed Mar. 4, 2002.

FIELD OF INVENTION

The domain of the invention is processing of signals transmitted in a channel that is or that might be disturbed.

BACKGROUND OF THE INVENTION

More precisely, the invention relates to a signal processing method making use of a MAP (Maximum A Posteriori) type algorithm. The MAP algorithm is presented particularly clearly in the article entitled "Statistical Inference for Probabilistic Functions of Finite State Markov Chains" by L. E. Baum and T. Pertie, Ann. Math. Stat. 37: 1554-1563, 1966.

The MAP algorithm, also called the Forward-Backward (FB) algorithm, is drawing a great deal of interest at the moment. In particular, this algorithm is capable of decoding a convolutive code by associating reliability information with decoded bits, and it can beneficially be used in many applications such as applications using a "turbo-code".

The following briefly describes the principle of the MAP algorithm. For the purposes of this description and throughout the remainder of the document, the term "MAP algorithm" includes MAP type algorithms, and also algorithms derived from MAP type algorithms, and particularly Log-MAP and Max-Log-MAP type algorithms.

Diagrammatically, the MAP algorithm may be considered as merging of information (node metrics) generated by two modified Viterbi decoders working on data in the backwards direction. Remember that the Viterbi algorithm, frequently used for decoding of received signals, consists of searching in a lattice representing the coding for the path corresponding to the most probable sequence of states, in other words searching for the path which is the minimum distance from the required sequence. This algorithm is described in the article by G. D. Forney, "The Viterbi Algorithm", Proceedings of the IEEE, vol. 61, No. 3, Mar. 1973.

The MAP algorithm can be used to determine the likelihood ratio of the a posteriori probability of states at instant k, $0 \leq k \leq K$ of a hidden Markov string with finite states, starting from observations $Y_0^K = \{Y_0, \ldots, Y_K\}$. A Markov chain is usually defined as a collection of consecutive random states chained one behind the other, in which the changeover from one state to another is associated with a probability called the transition probability.

A Markov chain $\{X_k\}$ with values in a finite space $E=\{1, \ldots N\}$ can thus be considered, defined by a states transition matrix $\Pi=(\pi_{i,j})$, with dimension N×N and an initial law $v=(v_i)^N_{i=1}$ defined by $v_i=\text{Prob}[X_0=i]$, $\forall i \in E$. According to the terminology conventionally used, a transition between two states $X_{k-1}$ and $X_k$ is defined by a pair of states and is denoted $\xi_k=(X_{k-1}, X_k)$. The matrix $\Pi$ is a transition matrix between states associated with $\{X_k\}$, for which the elements $\pi_{ij}$ are defined by:

$$\pi_{ij}=\text{Prob}[X_k=j/X_{k-1}=i], \text{ for all } i,j \in E \quad (1)$$

This document considers the case of hidden Markov models for which noisy observations are available $\{Y_k\}$ with value in $\Re^d$, collected through a channel without memory. In other words, observations $\{Y_k\}$ are mutually independent depending on transitions between states $\xi_k$, and each observation $Y_k$ is only dependent on the transition $\xi_k$ at the same instant k. Consequently, the observed signal model can be written in the following form:

$$Y_k = H(\xi_k) + B_k \quad (2)$$

where H(.) represents the transfer function of the channel without memory defined in E and with value in $\Re^d$, $\xi_k=(X_{k-1}, X_k)$ is a pair of states at instant k with value in E×E, $Y_k$ represents an observation at instant k with value in $\Re^d$ and where $B_k$ is added white noise.

In the context of digital communications, the model defined by equation (2) may be applied in equalisation: the channel H(.) then represents the transmission channel in base band and $X_k$ represents a series of symbols in the modulation alphabet, the width of which is equal to the channel memory.

During decoding of a convolutive code, H(.) then represents the code generator polynomials, and $X_k$ represents the memory contents of the channel coder.

We will now describe the concept of the likelihood ratio calculated in the context of the MAP algorithm in more detail.

The likelihood ratio $\Lambda_k^X$ of a set X belonging to the set of parts of E is defined as being the ratio of the a posteriori probability of set X to the a posteriori probability of the complement of X in E.

The likelihood ratio can be expressed in the form of the following equation:

$$\Lambda_k^X = \frac{\sum_{i \in X} PAP_k^i}{\sum_{i \notin X} PAP_k^i} \quad (3)$$

where $PAP_k^i = P[X_k=i/Y_0=y_0 \ldots, \ldots, Y_K=y_K]$, $0 \leq k \leq K$.

Classically, the MAP algorithm is associated with a lattice representation of the different states to be considered. Thus, if a convolutive coder is considered, the MAP algorithm uses the lattice representation of the variation of the coder with time, for decoding. The lattice is usually represented by a graph, in which the abscissas axis represents the time and the ordinates axis represents the different possible states. Therefore each node in the lattice is associated firstly with a state, and secondly with an instant k. The possible transitions between nodes of two successive instants k and k+1 are represented by branches.

The MAP algorithm involves two intermediate variables, called the "forward variable" and the "backward variable" respectively. These variables propagated by the MAP algorithm are calculated recursively, in the forward direction and in the backward direction respectively with respect to the lattice, and the result is a calculation of the likelihood ratio at each instant k.

These forward and backward variables defined in the remainder of the document use the probability of observing $y_k$ conditionally in the $X_k=j$ and $X_{k-1}=i$ states, expressed by the following equation:

$$b_{i,j}(Y_k)=\text{Prob}[Y_k=y_k/X_{k-1}=i, X_k=j] \quad (5)$$

Classically, this probability is called metric. It may possibly depend on k, and is a function of the probability density of the noise $B_k$.

The MAP algorithm proceeds in three steps, firstly a forward recursion step, secondly a backward recursion step, and finally a data merging step.

Forward recursion consists of calculating the probabilities $\alpha_i^k$ of passing through nodes representing the states $X_i=i$ at instants k, starting from information obtained by passing through the lattice in the direct direction. The forward variable $\alpha_i^k$ is thus defined as the probability of the event $(X_i=i, Y_0=y_0, \ldots Y_k=y_k)$:

$$\alpha_i^k = \text{Prob}[X_i=i, Y_0=y_0, \ldots Y_k=y_k] \quad (6)$$

It can be demonstrated that values of $\alpha_i^k$, $0 \leq k \leq K$ are calculated recursively as follows:

$$\alpha_i^{k+1} = \sum_{j \in E} \pi_{j,i} b_{j,i}(Y_{k+1}) \alpha_j^k$$

with the initial value $\alpha_i^0 = v_i$, $\forall i \in E$.

Similarly, the backward recursion consists of calculating the probabilities $\beta_i^k$ of passing through nodes representing the states $X_i=i$ at instants k, starting from information obtained by going through the lattice in the indirect direction. The backward variable $\beta_i^k$ is thus defined as the probability of the event $(X_i=i, Y_{k+1}=y_{k+1}, \ldots Y_k=y_k)$:

$$\beta_i^k = \text{Prob}[X_i=i, Y_{k+1}=y_{k+1}, \ldots Y_k=y_k] \quad (7)$$

It can be demonstrated that $\beta_i^k$, $0 \leq k \leq K$ are calculated recursively as follows:

$$\beta_i^k = \sum_{j \in E} \pi_{i,j} b_{i,j}(Y_{k+1}) \beta_j^{k+1}$$

with the initial value $\beta_i^k=1$, $\forall i \in E$.

The third step used by the MAP algorithm consists of merging the results of the two recursions to calculate the "a posteriori" probability of the states, by calculating the likelihood ratio of the detected symbols.

The likelihood ratio of a set of states defined by equation (3) can then be expressed as a function of the forward and backward intermediate variables in the following form:

$$\Lambda_k^X = \frac{\sum_{i \in X} \alpha_i^k \beta_i^k}{\sum_{i \notin X} \alpha_i^k \beta_i^k} \quad (8)$$

For example, in the context of symbol detection, the set X groups states corresponding to sending the same modulation symbol. In the context of channel decoding, the set X groups states corresponding to the same word at the input to the channel coder.

Although the MAP algorithm supplies very high performance results, it has the disadvantage that it is complex to implement.

In particular, the hardware implementation of the MAP algorithm is very difficult, and consequently receivers implementing this algorithm are expensive.

Problems with implementation of the classical MAP algorithm are partly due to the strong dispersion of probabilities $b_i^k$ that therefore requires high precision for the calculation of the "forward" variable $\alpha_i^k$ and the "backward" variable $\beta_i^k$. Moreover, calculation of the likelihood ratio as defined by equation (3) above means that divisions have to be imposed that are expensive and that can cause stability problems.

Log-MAP and Max-Log-MAP type algorithms have been proposed to solve these various disadvantages with the MAP algorithm.

Nevertheless, Log-MAP and Max-Log-MAP type algorithms, like MAP type algorithms, remain very complex to implement and require a large number of operations during the calculation of the likelihood ratio.

SUMMARY OF THE INVENTION

In particular, one purpose of the invention is to overcome these disadvantages according to prior art.

More precisely, one purpose of the invention is to provide a signal processing technique implementing a MAP algorithm that is less complex than techniques according to prior art. More particularly, one purpose of the invention is to enable a reduction in the number of calculations used, both by MAP type algorithms, and by Log-MAP or Max-Log-MAP type algorithms, and achieving a better performance/complexity ratio than in prior art.

Another purpose of the invention is to use such a technique, enabling the design of less complex receivers, and therefore less expensive than in the prior art.

Another purpose of the invention is to provide such a technique that makes a satisfactory compromise between firstly low complexity requirements, and secondly reliability of the results. In other words, the invention is intended to provide a method of systematically reducing the complexity of MAP, Log-MAP and Max-Log-MAP type algorithms, with a good approximation quality.

Thus, when classical MAP type algorithms usually necessitate the use of a number of operations in $A^{L-1}$, where L represents the length of the transmission channel, and where A represents the number of characters in the modulation alphabet, the invention is intended to provide a technique for implementing a MAP type algorithm using a number of operations in $A^M$, where $M<L-1$, while maintaining a good approximation quality of the likelihood ratio.

Another purpose of the invention is to implement such a technique that enables taking flexible decisions.

These objectives, and others that will become clear later, are satisfied by implementing a signal processing method that uses a MAP (Maximum A Posteriori) type algorithm to determine a likelihood ratio $\Lambda_k^X$ of a set of states X of a lattice at instant k, each of the said states being associated with at least two intermediate variables called the "forward" variable and the "backward" variable respectively, propagated by the said MAP algorithm and calculated recursively, in a direct direction and in an indirect direction respectively at the said instant k with respect to the said lattice.

According to the invention, such a method includes a step for reducing the number of states selected by the said MAP type algorithm during a calculation of the said likelihood ratio, and at least one determined value is assigned to the corresponding said forward and/or backward variable, so as to calculate an approximate likelihood ratio, at least for some non-selected states.

Thus, the invention is based on a new and inventive approach to the use of a MAP algorithm that simplifies the different signal processing steps while maintaining a satisfactory quality of results. The invention proposes to reduce the number of states selected by the MAP algorithm to calculate the likelihood ratio, so as to simplify the different steps used during such a calculation, and to assign determined values to the missing intermediate variables in order to calculate an approximate likelihood ratio. Therefore, the invention is based on an approximate MAP type algorithm with a lower calculation cost than conventional MAP algorithms. Therefore signal receivers using such an algorithm are less complex to construct than receivers according to prior art.

Advantageously, for a given instant k, the said at least one determined value a(k) assigned to the said "forward" variable is such that $$0 \leq a(k) \leq \operatorname*{Min}_{i \in M_k^f}(\alpha_i^k),$$

and/or the said at least one determined value b(k) assigned to the said "backward" variable is such that $$0 \leq b(k) \leq \operatorname*{Min}_{i \in M_k^b}(\beta_i^k),$$

where $M_k^f$ and $M_k^b$ represent a set of the said states selected in the said direct direction and in the said indirect direction respectively at the said instant k, and where $\alpha_i^k$ and $\beta_i^k$ represent the said forward and backward variables respectively at the said instant k.

Preferably, for a given instant k, the said determined value a(k) and/or b(k) is unique and is assigned to at least one "forward" variable $\alpha_i^k$ and/or "backward" variable $\beta_i^k$.

According to one advantageous embodiment of the invention, a constant value is assigned to the said "forward" and "backward" variables respectively, such that the said MAP type algorithm is a single-directional direct or indirect type algorithm respectively.

According to one advantageous characteristic of the invention, the said step to reduce the number of states uses a "breadth-first" type lattice search algorithm.

According to a first preferred variant, the said "breadth-first" type algorithm is an M type algorithm.

According to a second preferred embodiment, the said "breadth-first" type algorithm is a T type algorithm using at least one threshold.

Preferably, the said at least one threshold is variable as a function of the said instant k.

Advantageously, a predetermined value is assigned to the said variable threshold for each instant k.

Preferably, for each instant k, the value of the said variable threshold is determined by the use of an adaptive algorithm.

Advantageously, the said adaptive algorithm is a gradient type algorithm.

According to one advantageous characteristic of the invention, when the said lattice comprises several nodes each associated with one of the said states and at a given instant k, the value of the said variable threshold T at an instant (k+1) is determined by the following equation:

$$T(k+1)=T(k)-\mu(M(k)-M_c)$$

where T(k) represents the value of the said variable threshold at the said instant k, $M_c$ is the target number of propagated nodes in the said lattice, M(k) is the number of propagated nodes in the said lattice at instant k, and μ is a positive constant representing a learning gain.

Preferably, the said adaptive algorithm is a gradient type algorithm with variable pitch.

Advantageously, the said learning gain μ is a function of the said instant k.

Preferably, when the said "breadth-first" type algorithm is an M type algorithm, the said determined values a(k) and/or b(k) assigned to the said "forward" and/or "backward" variables respectively at a given instant k are given by the following equations:

$$a(k) = \operatorname*{Min}_{i \in M_k^f}(\alpha_i^k) - c_f$$

$$b(k) = \operatorname*{Min}_{i \in M_k^b}(\beta_i^k) - c_b$$

where $c_f$ and $c_b$ are two positive constants.

Preferably, when the said "breadth-first" type algorithm is a T type algorithm, the said determined values a(k) and/or b(k) assigned to the said forward and/or backward variables at a given instant k respectively, are given by the following equations:

$$a(k)=T^f(k)-c_f$$

$$b(k)=T^b(k)-c_b$$

where $c_f$ and $c_b$ are two positive constants, and where $T^f(k)$ and $T^b(k)$ denote the value of the said variable threshold at instant k in the said direct direction and in the said indirect direction respectively.

Advantageously, the said MAP type algorithm belongs to the group comprising:

MAP type algorithms;

Log-MAP type algorithms;

Max-Log-MAP type algorithms.

It will be noted that the "forward" and "backward" variables may have different definitions depending on the type of algorithm used (MAP, Log-MAP or Max-Log-MAP), as described in detail in the remainder of the document.

Preferably, the said MAP type algorithm is a single-directional algorithm, and the said method uses a step to compare decisions made by the said single-directional algorithm with the corresponding decisions made by a Viterbi type algorithm, called Viterbi decisions.

In this presentation, and in the remainder of the document, a Viterbi algorithm is an algorithm with a small number of states with which a "trace-back" operation is associated (in other words, decoding of the algorithm). Thus, Viterbi decisions are decisions output by an algorithm with a reduced number of states, with which a "trace-back" is associated.

According to a first advantageous characteristic, in the case of a negative comparison for at least one of the said decisions made by the said single-directional algorithm, the said method uses a substitution step for the said Viterbi decision corresponding to the said decision made by the said single-directional algorithm, called the substituted decision.

Preferably, a determined value V is assigned to the absolute value of the said likelihood ratio associated with the said substituted decision.

Advantageously, the said determined value V is equal to the absolute value of the average likelihood ratio of the sequence.

Therefore, V corresponds to the average of reliabilities, which is approximately equal to the average reliability of the sequence.

According to a second advantageous characteristic, in the case of a negative comparison for at least one of the said decisions made by the said single-directional algorithm, the said method uses a weighting step of the said likelihood ratio associated with the said decision considered, taking account of the said Viterbi decision.

Preferably, when Y is a set of states associated with a decision $D_i^Y$ output by the said Viterbi type algorithm at instant i, and $\Lambda_i^y$ represents the likelihood ratio associated with Y at instant i as calculated by the said single-directional algorithm during the said weighting step, the value of $\Lambda_i^y$ is replaced by $\tilde{\Lambda}_i^Y$ defined by $\tilde{\Lambda}_i^Y = \Lambda_i^y + D_i^Y \times V$, where V is a determined value.

The invention is advantageously applicable to at least one of the domains belonging to the group comprising:
  symbol detection;
  signal coding/decoding;
  turbo-decoding;
  turbo-detection;
  source coding by quantification (particularly quantification in lattice).

The invention also relates to a communication signals receiver comprising means of implementation of a MAP (Maximum A Posteriori) type algorithm to determine a likelihood ratio $\Lambda_k^X$ of a set of states X of a lattice at instant k, each of the said states being associated with at least one intermediate variable belonging to the group comprising a so-called "forward" variable and a so-called "backward" variable propagated by the said MAP algorithm and calculated recursively in a direct direction and in an indirect direction respectively at the said instant k with respect to the said lattice.

According to the invention, such a receiver comprises means of reducing the number of states selected by the said MAP type algorithm in order to make a calculation of the said likelihood ratio, and for at least some non-selected states, at least one determined value is assigned to the corresponding said forward variable and/or backward variable, so as to calculate an approximate likelihood ratio.

Other characteristics and advantages of the invention will become clearer after reading the following description of a preferred embodiment given as a simple illustrative and non-limitative example.

DETAIL DESCRIPTION OF THE PREFERRED EMBODIMENTS

The general principle of the invention is based on a reduction in the number of states selected during the calculation of the likelihood ratio of the MAP algorithm, so as to produce a simplified MAP algorithm. In one preferred embodiment of the invention, this type of reduction is achieved particularly by using a "breadth-first" type algorithm.

Before starting a detailed description of the figures mentioned above, we will present the principle of a reduction in the number of states used by the invention, and the different equations determined by the inventors.

In one preferred embodiment of the invention, the inventors envisaged the use of "breadth-first" type algorithms, and particularly M type and T type algorithms to implement the MAP algorithms with a reduced number of states.

As for the Viterbi algorithm (described particularly in the article by G. D. FORNEY "The Viterbi algorithm", Proceedings of the IEEE, vol. 61, No. 3, March 1973), the M algorithm is a lattice "breadth-first" type search algorithm (this type of algorithm examines the cost associated with a family of states at every instant). The M type algorithm is described particularly by J. B. Anderson and S. Mohan in "Sequential Coding algorithms; A survey and cost analysis", IEEE Trans. on Communications, Vol. COM-32, February 1984.

Figure 1:
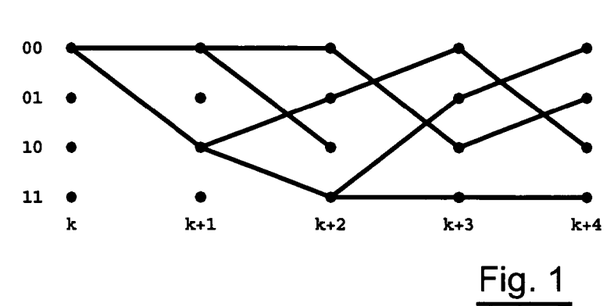
FIG. 1 shows a lattice representing a plurality of states associated with a MAP algorithm according to the invention.

For each lattice depth in FIG. 1, the Viterbi algorithm only keeps the best path passing through each node, shown in thick lines in FIG. 1.

The M type algorithm keeps the M best paths thus passing through the M best nodes, where M is an integer less than the number of nodes in the lattice of the Viterbi algorithm. Thus, when using the M algorithm, the nodes in the lattice (symbolised by black dots on the lattice in FIG. 1) need to be classified as a function of their cumulated metric (note that the cumulated metric of nodes in the lattice is equivalent to the forward variable) so as to select the M best nodes.

The T type algorithm is also a "breadth-first" type algorithm but is different from the M algorithm by the method used to select the nodes in the lattice in FIG. 1 propagated by the algorithm. The T algorithm selects only the nodes in the lattice associated with a cumulated metric for which the distance to the best cumulated metric of the lattice is less than a threshold T.

According to the invention, it is advantageously planned to introduce new "breadth-first" type T algorithms with a variable threshold. The inventors envisaged two distinct approaches to achieve this:

in a first variant embodiment of the invention, a threshold calculated a priori is assigned to each transition (remember that a transition from one state to another is symbolised by a branch of the lattice in FIG. 1). This threshold is calculated by using the finite length of the observation sequence (the observation sequence on the lattice in FIG. 1 begins at instant k and terminates at instant k+4). Thus, if a lattice with length K+l is considered, in which BMAX represents the maximum value of the branch metrics, the threshold T(k) will be chosen such that:

$T(k) \leq (K+1-k)B\text{MAX}$ and $0 \leq k \leq K;$ in a second variant embodiment of the invention, the value of the threshold of the T algorithm is fixed using an adaptive algorithm. An advantage of the T type algorithm compared with the M algorithm is that with a T type algorithm, there is no need to classify nodes in the lattice as a function of their cumulated metric in order to select the best nodes. The T type algorithm only imposes that the best node in the lattice is found in order to normalize cumulated metrics of all nodes in the lattice. In this second variant embodiment of the invention, the inventors have envisaged using an adaptive algorithm to fix the threshold of the T algorithm in order to slave its complexity.

For example, the threshold can be updated using a gradient algorithm and the following equation:

$$T(k+1)=T(k)-\mu(M(k)-M_c) \quad (9)$$

where $M_c$ represents the target number of propagated nodes, $M(k)$ represents the number of nodes propagated at instant k, and $\mu$ is a small positive constant that is called the learning gain.

The algorithm can also be generalized to the case in which $\mu$ depends on k, as is the case for gradient type algorithms with variable pitch.

We will now present the implementation of these "breadth-first" type algorithms in more detail in the context of a reduction in the number of states of MAP type algorithms.

The invention advantageously proposes to assign default values $a(k)$ and $b(k)$ to the "forward" and "backward" variables respectively at each instant k, so that MAP type algorithms can be used with fewer states.

Let $M_k^f$ and $M_k^b$ be the sets of states selected in the forward and backward directions respectively at instant k.

If the state $X_k=i$ forms part of the set $M_k^f$, then this state was selected at instant k.

Since the "forward" variables $\alpha_i^k$ are associated with probabilities, they must satisfy the normalization condition $$\sum_{i=1}^{N} \alpha_i^k = 1.$$

It can be demonstrated that if this condition is to be satisfied, then $a(k)$ must be chosen such that:

$$a(k) = \frac{1}{N-M} \sum_{i \notin M_k^f} \alpha_i^k \quad (10)$$

It is quite obvious that the forward variables $\alpha_i^k$ for $i \notin M_k^f$ are not accessible (since the associated states are not selected, by definition of $M_k^f$), and therefore it is only possible to determine the limits of the variation interval of $a(k)$. Assuming that the M states elements of $M_k^f$ have the M highest a posteriori probabilities (or APP), $a(k)$ is bounded by:

$$0 \le a(k) \le \min_{i \in M_k^f}(\alpha_i^k) \quad (11)$$

If $a(k)$ is fixed to 0 regardless of k, it can be considered that the unpropagated states have a zero APP and do not participate in the likelihood calculation given by equation (8). In other words, this is equivalent to assigning an absolute confidence to the choice of the M propagated states.

On the other hand, if $a(k)$ is fixed at its maximum value, then minimum confidence is assigned to the choice of the M propagated states.

The same reasoning can be applied to "backward" variables, so that $b(k)$ is determined such that:

$$0 \le b(k) \le \min_{i \in M_k^b}(\beta_i^k) \quad (12)$$

Equations (11) and (12) above may be refined in the context firstly of using an M type algorithm, and secondly a T type threshold algorithm.

When an M type algorithm is used, the classification of states selected in the direct (or "forward") direction and the indirect (or "backward") direction are used at each instant k, as a function of the values of $\alpha_i^k$ and $\beta_i^k$ respectively. Therefore, it is easy to determine the values of $$\min_{i \in M_k^f}(\alpha_i^k) \text{ and } \min_{i \in M_k^b}(\beta_i^k),$$

and therefore to assign the following values to $a(k)$ and $b(k)$:

$$a(k) = \min_{i \in M_k^f}(\alpha_i^k) - c_f \quad (13)$$

$$b(k) = \min_{i \in M_k^b}(\beta_i^k) - c_b \quad (14)$$

where $c_f$ and $c_b$ are two positive constants. These two constants $c_f$ and $c_b$ are used to adjust the confidence assigned to the choice of the propagated states.

In the case of a T type algorithm, in other words when the states propagated by the algorithm are selected by a threshold (fixed or variable with time as proposed above), the determination of the minimum values of the equations (11) and (12) requires a large additional calculation load. Consequently, for this class of algorithm, the inventors propose to fix $a(k)$ and $b(k)$ by means of the threshold:

$$a(k)=T^f(k)-c_f \quad (15)$$

$$b(k)=T^b(k)-c_b \quad (16)$$

where $T^f(k)$ represents the threshold in the "forward" direction at instant k, and where $T^b(k)$ represents the threshold in the "backward" direction at instant k (for example as defined by equation (9) above), where $c_b$ and $c_f$ are two positive constants.

In practice, Log-MAP or Max-Log-MAP type algorithms are frequently preferred to classical map algorithms, to simplify the implementation. The calculation of the likelihood ratio as defined by equation (3) above requires divisions for classical MAP type algorithms, and these divisions are expensive and may cause stability problems. This is why it is usually preferred to use algorithms working in the logarithmic range, that propagate the inverse logarithm of "forward" and "backward" variables and lead to the calculation of the logarithm of the likelihood ratio, also called Log-Likelihood Ratio (LLR) defined by:

$$LLR_k^X = -\mathrm{Log}\left(\frac{\sum_{i \in X} PAP_k^i}{\sum_{i \notin X} PAP_k^i}\right) \quad (3a)$$

where $PAP_k^i = P[X_k=i/Y_0=y_0, \ldots, Y_K=y_K]$, $0 \le k \le K$.

If we consider a convolutive coder generating symbols $X_k$ transmitted by a noisy channel to a receiver that receives symbols $Y_k$ and implements a Log-MAP type algorithm to decode the received bits, the sign of $LLR_k^X$ gives the value of the decoded bit and its absolute value indicates the decision quality.

Application of the reduction in the number of states principle presented above for classical MAP algorithms, to Log-MAP or Max-Log-MAP type algorithms is presented below:

Let $\bar{\alpha}_i^k = -\text{Log}(\alpha_i^k)$ and $\bar{\beta}_i^k = -\text{Log}(\beta_i^k)$ be the "forward" and "backward" logarithmic variables. According to the invention, the missing logarithmic variables for Log-MAP and Max-Log-MAP type logarithms with a reduced number of states are replaced in the forward and backward directions by $\bar{a}(k)$ and $\bar{b}(k)$ respectively, defined as follows:

$$\bar{a}(k) \geq \underset{i \in M_i^f}{\text{Max}}(\bar{\alpha}_i^k) \quad (17)$$

$$\bar{b}(k) \geq \underset{i \in M_i^p}{\text{Max}}(\bar{\beta}_i^k) \quad (18)$$

Thus according to the invention, when the reduction in the number of states of the Log-MAP or the Max-Log-MAP type algorithm is done using a "breadth-first" algorithm using a sort algorithm (in other words an M type algorithm), the missing data are replaced by:

$$\bar{a}(k) \geq \underset{i \in M_i^f}{\text{Max}}(\bar{\alpha}_i^k) + \bar{c}_f \text{ for the forward direction} \quad (19)$$

$$\bar{b}(k) \geq \underset{i \in M_i^p}{\text{Max}}(\bar{\beta}_i^k) + \bar{c}_b \text{ for the backward direction} \quad (20)$$

where $\bar{c}_f$ and $\bar{c}_b$ are two positive constants.

Concerning "breadth-first" algorithms using a threshold to select states propagated in the "forward" and "backward" directions (in other words T type algorithms), the missing data are replaced by:

$$\bar{a}(k) = T^f(k) + \bar{c}_f \text{ for the forward direction} \quad (21)$$

$$\bar{b}(k) = T^b(k) + \bar{c}_b \text{ for the backward direction} \quad (22)$$

where $T^f(k)$ and $T^b(k)$ are the forward and backward thresholds respectively (possibly varying as a function of the time k, as proposed above).

The invention also provides a means of combining aspects related to simplification of classical MAP type algorithms (in other words MAP, Log-Map and Max-Log-MAP) with the principle of reducing states described above.

As mentioned above, the MAP, Log-MAP and Max-Log-MAP algorithms require the propagation of forward and backward variables in the direct and indirect directions respectively, compared with the associated lattice.

In one variant embodiment of the invention, it is proposed to simplify these algorithms by fixing "forward" and "backward" variables equal to a predetermined value, preferably constant, so as to produce single-directional algorithms. Thus, the "forward" variables, $\alpha_i^k$ and $\bar{\alpha}_i^k$ can be fixed equal to an arbitrary constant value regardless of the values of k and i, to obtain "indirect" MAP, Log-MAP or Max-Log-MAP algorithms. Similarly, the backward variables $\beta_i^k$ or $\bar{\beta}_i^k$ can be fixed equal to an arbitrary constant value regardless of the values of k and i, to obtain "direct" algorithms.

The principle of reducing the number of states can then be applied to these direct and/or indirect algorithms using "breadth-first" type algorithms described above, so as to obtain direct and/or indirect algorithms with a reduced number of states. Thus, for example, in the case of an indirect MAP algorithm for which all forward variables $\alpha_i^k$ have been fixed to a constant value, the missing backward variables $\beta_i^k$ (corresponding to unselected states) are replaced by a predetermined value b(k), as described above in the document.

This type of missing data management makes direct and indirect algorithms using a small number of states more efficient. When the number of propagated states is small, it is probable that at least one of the sets on which the likelihood ratio defined by equation (3) is calculated, will be empty.

The proposed method, according to which default values are assigned to the intermediate variables necessary for the calculation of the likelihood ratio but corresponding to unpropagated states of the lattice, can then be used to determine the likelihood ratio as soon as there are at least two states propagated in the lattice, and to assign a soft value to it. If the value 0 is assigned to the probability of an unpropagated state, the values of the likelihood ratio equal to $$\frac{0}{\text{constant}}$$

or $$\frac{\text{constant}}{0}$$

will be obtained for MAP type algorithms. For Log-MAP type algorithms, values of the likelihood ratio equal to $-\infty$ or $+\infty$ are obtained.

One disadvantage of these single-directional algorithms that has been identified by the inventors, is that decisions made by these algorithms, in other words the sign of the likelihood ratios defined by equation (3) (or (3a)) are usually different from decisions taken by algorithms using a "trace-back". (Remember that algorithms using a "trace-back" enable a decision to be taken using the most likely path).

The transition matrix Π might not allow the states associated with decisions made by the different single-directional algorithms. Therefore, in one new advantageous embodiment of the invention, it is envisaged to use a single-directional algorithm with a small number of states with a comparative trace-back or a weighted comparative trace-back.

Figure 2:
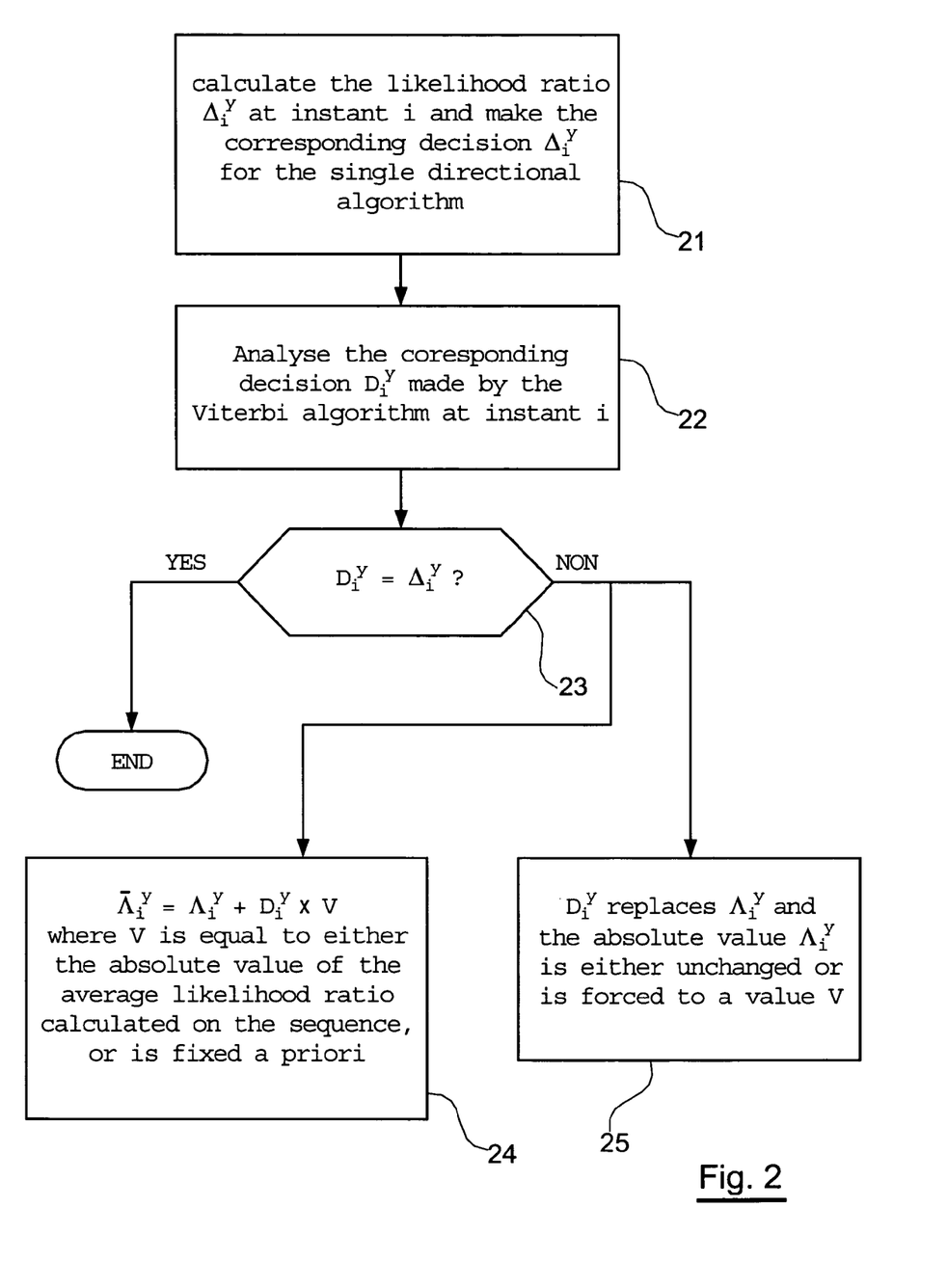
FIG. 2 represents a flowchart illustrating the comparative or weighted comparative "trace-back" principle, used according to the invention in combination with single-directional MAP algorithms.

According to the invention, the comparative "trace-back" consists of comparing decisions made by a single-directional algorithm with the corresponding decisions made by a Viterbi type algorithm as shown in FIG. 2. A set of states Y is considered, associated with the decision $D_i^Y$ output by the Viterbi type algorithm at time i. Let $\Lambda_i^Y$ be the likelihood associated with Y at time i, calculated by the single-directional algorithm, and let $\Delta_i^Y$ be the corresponding decision taken by the single-directional algorithm.

During a first step reference 21, the likelihood ratio $\Lambda_i^Y$ is calculated so as to make a decision $\Delta_i^Y$ for the single-directional algorithm. The corresponding decision $D_i^Y$ for the Viterbi type algorithm is analysed (22) and these two decisions $\Delta_i^Y$ and $D_i^Y$ are compared (23).

If the two decisions are different, then the decision taken by the Viterbi type algorithm replaces (25) the decision made by the single-directional algorithm. The absolute value of the likelihood ratios assigned to these decisions remains unchanged or is forced to a value V. V is fixed a priori to be equal to a small value, or is calculated for each sequence. If it is calculated for each sequence, V may for example be fixed equal to the absolute value of the average likelihood ratio of the sequence.

Rather than having to make a clear choice between the decision made by the Viterbi type algorithm $D_i^Y$ and the decision produced by the single-directional algorithm $\Delta_i^Y$, it would also be possible to weight these two decisions: this is called the weighted comparative "trace back" principle, also shown in FIG. 2.

When the comparative weighted "trace back" step has been completed, the likelihood $\Lambda_i^Y$ is replaced (24) by $\tilde{\Lambda}_i^Y$, defined by:

$$\tilde{\Lambda}_i^Y = \Lambda_i^Y + D_i^Y \times V \tag{23}$$

where V is equal to the absolute value of the average likelihood ratio calculated on the sequence, or fixed a priori.

Figure 3:
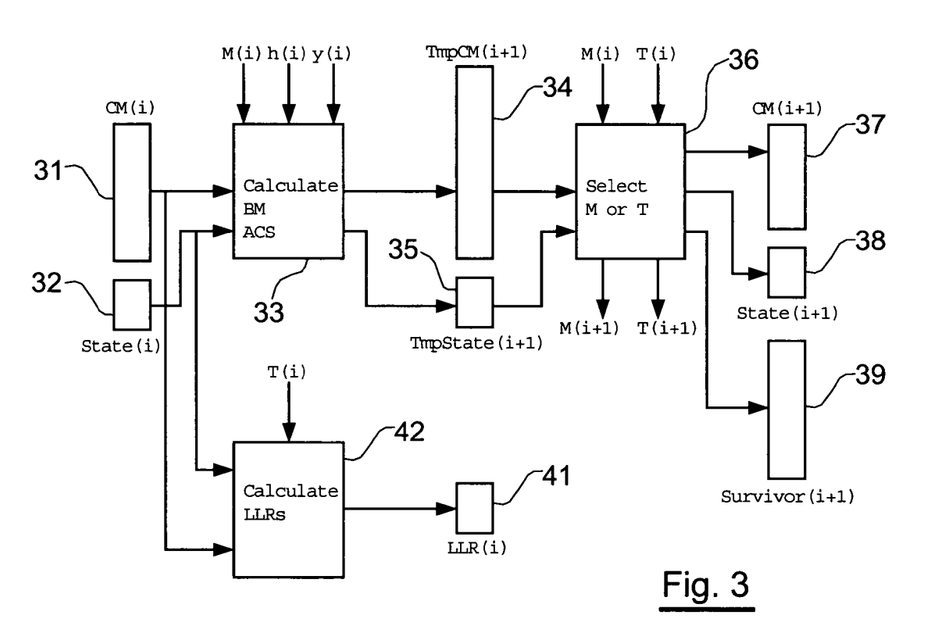
FIG. 3 shows a block diagram of the different calculation steps used by the single-directional MAP type algorithm in FIG. 2, applied to detection of symbols in an alphabet with A words, where $A=2^Q$.

We will now present an embodiment of the different calculation steps used by a single-directional logarithmic MAP type algorithm according to the invention, with reference to FIG. 3, applied to detection of symbols in an alphabet with A words, where $A=2^Q$.

The CM(i) vector 31 contains cumulated metrics M(i) corresponding to the M(i) states retained at instant i stored in the State(i) vector 32 with size M(i) times Q bits.

The "calculate BM and ACS" block 33 calculates A.M(i) cumulated metrics associated with the A.M(i) states following the M(i) states in the State(i) vector 32. It then selects the best states converging towards the same node. This selection consists of either selecting the states that have the smallest cumulated metric (in the case of a single-directional Max-Log-MAP type algorithm), or recursively performing a correction comparison operation by using the Jacobian logarithm formula (in the case of a single-directional Log-Map type algorithm).

Thus, in the case of a single-directional Log-Map type algorithm, this method includes three main steps:

a) Step 1: calculate the branch metric $BM(i,j)=\ln(b_{ij}(y_k))$ in accordance with equation (5) described above. Note that the branch metric is expressed simply as a Euclidean distance.

b) Step 2: accumulation.

The variables $\alpha_1^k$ (respectively $\beta_i^k$) and are updated in a simplified manner. At instant k−1, two nodes $P_0$ and $P_1$ are considered associated with the forward variables $\alpha^{k-1}_{P0(f)}$ and $\alpha^{k-1}_{P1(f)}$ respectively. At the next instant k, the final node associated with the cumulated metric $CM_j(k)$ is considered. The branch metric from node $P_0$ to the final node is $BM(P_0(j), j)$ and the branch metric from node $P_1$ to the final node is $BM(P_1(j), j)$. We then get:

$$\alpha_j^k = \max[(\alpha_{P1(j)}^{k-1} + BM(P_1(j), j)), (\alpha_{P0(j)}^{k-1} + BM(P_0(j), j))]$$

c) Step 3: selection

The best path that converges towards each node is selected, and this step is used for the "trace back".

The first and third steps for a Log-MAP type algorithm are identical, but during the second step to update the forward variables, we use:

$$\alpha_j^k = \max[(\alpha_{P1(j)}^{k-1} + BM(P_1(j), j)), (\alpha_{P0(j)}^{k-1} + BM(P_0(j), j))] +$$
$$f(|(\alpha_{P1(j)}^{k-1} + BM(P_1(j), j) - (\alpha_{P0(j)}^{k-1} + BM(P_0(j), j))|),$$

where $f(z)=\ln(1+\exp(-z))$.

The metrics of the best nodes selected by the "calculate BM and ACS" block 33 are saved in the TmpCM(i+1) vector 34. The number of states selected in this step is between M(i) and A.M(i). The corresponding states selected in this step are stored in the TmpState(i+1) vector 35.

The "select M or T" block 36 is used to select states propagated by the MAP algorithm.

If the reduction in the number of states uses a T type algorithm, the "select M or T" block 36 selects states for which the cumulated metric distance starting from the best cumulated metric is less than a threshold T.

If the reduction in the number of states uses an M type algorithm, the "select M or T" block 36 selects the best M states.

In the case of a T type algorithm, the "select M or T" block 36 also calculates the new threshold T(i+1) as a function of the number of selected states M(i), applying the threshold T(i) as described previously in equation (9).

After the selection step performed by the block reference 36, the M(i+1) cumulated metrics corresponding to the M(i+1) states selected at instant i+1 stored in the State(i+1) vector 38 with size M(i+1) times Q bits, are stored in the CM(i+1) vector 37.

The Survivor(i+1) vector 39 with size equal to N Q-bit words contains the index of the M(i) branches that converge towards the selected M(i) states stored in the State(i) vector 32. The state towards which the winning branch of the lattice converges is coded by the address at which the branch index is stored, on Q bits.

The "trace back" operation is performed using all Survivor (i+1) vectors 39, for i varying from 0 to K−1, in order to determine decisions to be compared with or weighted by decisions determined by the LLR (Log-Likelihood Ratio) calculation block 40, as described above in relation to FIG. 2.

Figure 4:
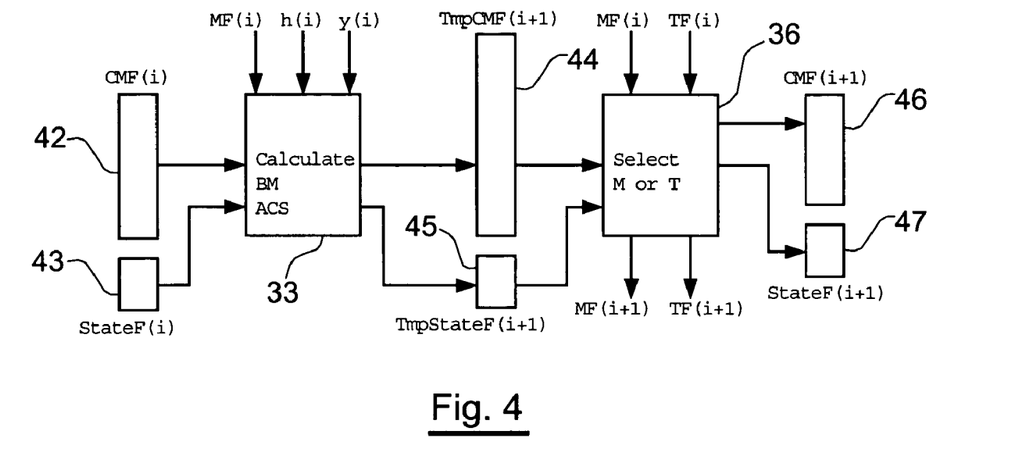
FIG. 4 illustrates the different steps in the calculation of forward variables used by a two-directional MAP type algorithm according to the invention.

We will now describe an embodiment of the forward variables calculation for a two-directional MAP logarithm according to the invention, in relation to FIG. 4.

Remember that two-directional Log-MAP or Max-Log-MAP algorithms with a small number of states begin with a first step in which the forward variables are calculated recursively in the same way as single-directional algorithms.

FIG. 4 illustrates the calculation of the list of states kept and cumulated metrics in the direct or forward direction.

Unlike single-directional algorithms presented in FIG. 3, the cumulated metrics of the CMF(i) vector 42, the corresponding selected states of the StateF(i) vector 43, and possibly the number of states selected at each instant, are stored so that they can be used to calculate the likelihood ratios LLR during the backward step.

As shown in FIG. 3, the CMF(i) vector 42 contains the cumulated metrics MF(i) corresponding to the MF(i) states selected in the forward direction at instant i stored in the StateF(i) vector 43 with size equal to MF(i) times Q bits.

The "calculate BM and ACS" block 33 calculates the A.MF (i) cumulated metrics associated with the A.MF(i) states following the MF(i) states of the State F(i) vector 43. Then, it selects the best states converging towards the same node, using a method similar to that described with reference to FIG. 3.

The metrics of the best nodes selected by the "calculate BM and ACS" block 33 are stored in the TmpCMF(i+1) vector 44. The number of states selected in this step is between MF(i) and A.MF(i). The corresponding states selected in this step are stored in the TmpStateF(i+1) vector 45.

The "select M or T" block 36 is used to select states propagated by the MAP algorithm.

If the reduction in the number of states uses a T type algorithm, the "select M or T" block 36 selects the states for which the distance between the cumulated metric and the best cumulated metric is less than a threshold T.

If the reduction in the number of states uses an M type algorithm, the "select M or T" block 36 selects the M best states.

In the case of the T type algorithm, the "select M or T" block 36 also calculates the new threshold TF(i+1) in the forward direction as a function of the number of selected states MF(i) by applying the threshold TF(i) as previously described in equation (9).

After the selection step carried out by the block reference 36, the MF(i+1) cumulated metrics corresponding to MF(i+1) states selected at instant i+1 stored in the StateF(i+1) vector 47 with a size equal to MF(i+1) times Q bits, are stored in the CMF(i+1) vector 46.

Figure 5:
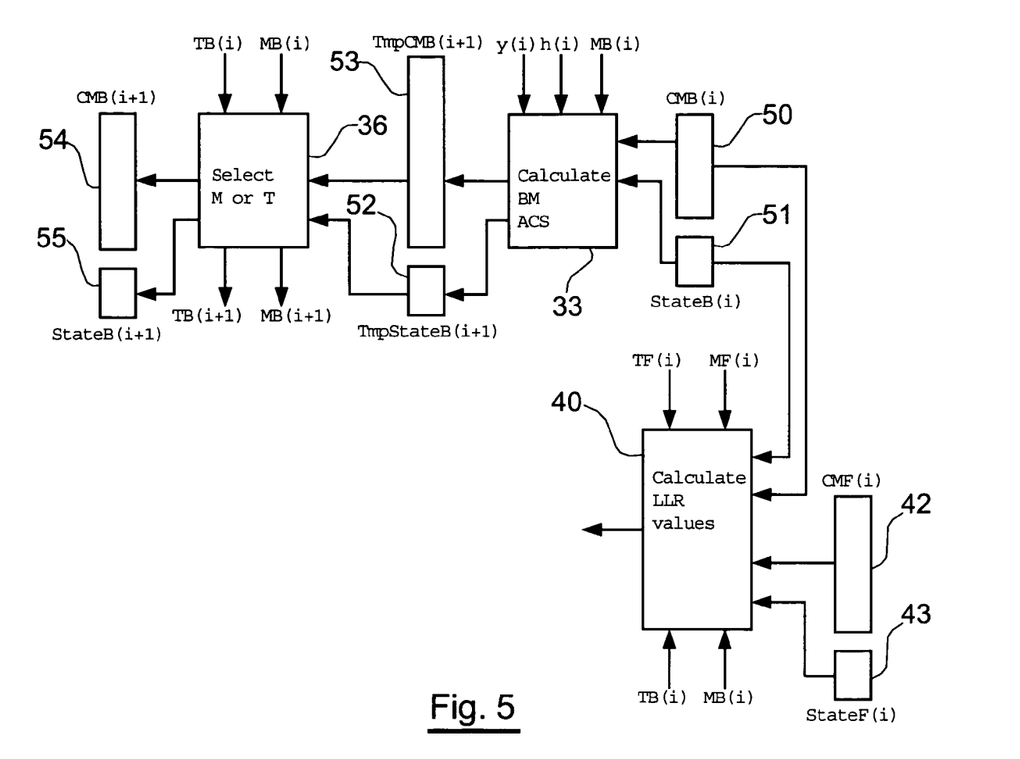
FIG. 5 describes the different steps in the calculation of backward variables used by the algorithm DETAILED DESCRIPTION OF THE PREFERRED EMBODIMENTS in FIG. 3, and the different steps in the calculation of likelihood ratios.

The cumulated backward metrics of the CMB(i) vector 50 and the selected states stored in the StateB(i) vector 51 are calculated symmetrically to the forward calculation as shown in FIG. 5. FIG. 5 also presents the calculation of LLR values from forward variables (cumulated metrics, list of states and possibly thresholds) memorised in the direct direction, and new variables calculated in the indirect direction.

Thus, the CMB(i) vector 50 contains the MB(i) cumulated metrics corresponding to the MB(i) selected states in the backward direction at instant i stored in the StateB(i) vector 51 with size equal to Mb(i) times Q bits.

The "calculate BM and ACS" block 33 calculates the A.MB(i) cumulated metrics associated with the A.MB(i) states following the MB(i) states of the StateB(i) vector 51. The next step is selection of the best states converging towards the same node, using a method similar to that described with reference to FIGS. 3 and 4.

The metrics for the best nodes selected by the "calculate BM and ACS" block 33 are saved in the TmpCMB(i+1) vector 53. The number of states selected in this step is between MB(i) and A.MB(i). The corresponding states selected in this step are stored in the TmpStateB(i+1) vector 52.

The "select M or T" block 36 is used to select the states propagated by the MAP algorithm.

If the reduction in the number of states uses a T type algorithm, the "select M or T" block 36 selects the states for which the distance between the backward cumulated metric and the best cumulated metric is less than a threshold T.

If the reduction in the number of states uses an M type algorithm, the "select M or T" block 36 selects the M best states.

In the case of a T type algorithm, the "select M or T" block 36 also calculates the new threshold in the backward direction Tb(i+1) as a function of the number of selected states MB(i) by applying the TB(i) threshold as described above in equation (9).

After the selection step performed by the block reference 36, the MB(i+1) cumulated metrics corresponding to the MB(i+1) states selected at instant i+1 stored in the StateB(i+1) vector 55 with size equal to MB(i+1) times Q bits, are stored in the CMB(i+1) vector 54.

The LLR calculation 40 uses the cumulated metrics of the CMF(i) vector 42 and the CMB(i) vector 50, and the selected states stored in the StateF(i) vector 43 and the StateB(i) vector 51. For the forward direction, the cumulated metrics of the CMF(i) vector 42, the states of the StateF(i) vector 43, and possibly the thresholds TF(i) and the number of selected states MF(i) are stored for all sequences, in other words for i varying from 1 to K.

The "calculate LLR" block 40 may use TF(i) and TB(i) thresholds in the case of a reduction in the number of states using a T type algorithm, or the less good cumulated metrics CMB(M) and CMF(M) in the case of a reduction in the number of states using an M type algorithm, to manage the missing data, as described above. In the same way as for single-directional algorithms, the LLR calculation uses the Max-Log-Map approximation or the Jacobian logarithm formula for Log-Map type algorithms.

The invention claimed is:

1. Signal processing method using a MAP (Maximum A Posteriori) type algorithm to determine a likelihood ratio $A_k^X$ of a set of states X of a lattice at instant k, each of the said states being associated with at least one intermediate variable, belonging to the group including a so-called "forward" variable and a so-called "backward" variable, propagated by the said MAP algorithm and calculated recursively, in a direct direction by a first Viterbi decoder and in an indirect direction by a second Viterbi decoder respectively at the said instant k with respect to the said lattice, wherein the method comprises the following steps performed by a communication signal receiver:

reducing the number of states selected by the said MAP type algorithm so as to calculate the said likelihood ratio;

calculating said likelihood ratio for the selected states;

assigning at least one determined value to the corresponding said forward variable calculated by the first Viterbi decoder and/or backward variable calculated by the second Viterbi decoder, so as to calculate an approximate likelihood ratio, at least for some non-selected states; and calculating said approximate likelihood ratio at least for some non-selected states; and wherein at a given instant k, with $0 \leq k \leq K$, said at least one determined value a(k) assigned to said forward variable is smaller than a minimum value of said forward variable at said instant k and/or said at least one determined value b(k) assigned to said backward variable is smaller than a minimum value of said backward variable at said instant k.

2. Method according to claim 1, wherein at a given instant K, the said at least one determined value a(k) assigned to the said forward variable is such that $$0 \leq a(k) \leq \min_{i \in M_k^f}(\alpha_i^k),$$

and/or the said at least one determined value b(k) assigned to the said backward variable is such that $$0 \leq b(k) \leq \min_{i \in M_k^b}(\beta_i^k),$$

where $M_k^f$ and $M_k^b$ represent a set of the said states selected in the said direct direction and in the said indirect direction respectively at the said instant k, and where $\alpha_i^k$ and $\beta_i^k$ represent the said forward and backward variables respectively at the said instant k.

3. Method according to claim 2, wherein at a given instant k, the said determined value a(k) and/or b(k) is unique and is assigned to at least one forward variable $\alpha_i^k$ and/or backward variable $\beta_i^k$.

4. Method according to claim 2, wherein the said step to reduce the number of states uses an M type "breadth-first" lattice search algorithm, and the said determined values a(k) and/or b(k) assigned to the said "forward" and/or "backward" variables respectively, at a given instant k are given by the following equations:

$$a(k) = \operatorname*{Min}_{i \in M_k^f}(\alpha_i^k) - c_f$$

$$b(k) = \operatorname*{Min}_{i \in M_k^b}(\beta_i^k) - c_b$$

where $c_f$ and $c_b$ are two positive constants.

5. Method according to claim 2, wherein the said step to reduce the number of states uses a T type "breadth-first" lattice search algorithm, and the said determined values a(k) and/or b(k) assigned to the said forward and/or backward variables at a given instant k respectively, are given by the following equations:

$$a(k)=T^f(k)-c_f$$

$$b(k)=T^b(k)-c_b$$

where $c_f$ and $c_b$ are two positive constants, and where $T^f(k)$ and $T^b(k)$ denote the value of the said variable threshold at said instant k in the said direct direction and in the said indirect direction respectively.

6. Method according to claim 1, wherein a constant value is assigned to the said forward and backward variables respectively, such that the said MAP type algorithm is a single-directional direct or indirect type algorithm respectively.

7. Method according to claim 6, wherein since the said MAP type algorithm is a single-directional algorithm, the said method uses a step to compare decisions made by the said single-directional algorithm with the corresponding decisions made by a Viterbi type algorithm, called Viterbi decisions.

8. Method according to claim 7, wherein in the case of a negative comparison for at least one of the said decisions made by the said single-directional algorithm, the said method uses a substitution step for the said Viterbi decision corresponding to the said decision made by the said single-directional algorithm, called the substituted decision.

9. Method according to claim 8, wherein a determined value V is assigned to the absolute value of the said likelihood ration associated with the said substituted decision.

10. Method according to claim 9, wherein the said determined value V is equal to the absolute value of the average likelihood ratio of the sequence.

11. Method according to claim 7, wherein in the case of a negative comparison for at least one of the said decisions made by the said single-directional algorithm, the said method uses a step for weighting the said likelihood ratio associated with the said decision considered, taking account of the said Viterbi decision.

12. Method according to claim 11, wherein when Y is a set of states associated with a decision $D_i^Y$ output by the said Viterbi type algorithm at instant i, and $\Lambda_i^y$ represents the likelihood ratio associated with Y at instant i as calculated by the said single-directional algorithm during the said weighting step, the value of $\Lambda_i^y$ is replaced by the $\tilde{\Lambda}_i^Y$ defined by $\tilde{\Lambda}_i^Y = \Lambda_i^y + D_i^Y \times V$, where V is a determined value.

13. Method according to claim 1, wherein the said step to reduce the number of states uses a "breadth-first" type lattice search algorithm.

14. Method according to claim 13, wherein the said "breadth-first" type algorithm is an M type algorithm.

15. Method according to claim 13, wherein the said "breadth-first" type algorithm is a T type algorithm using at least one threshold.

16. Method according to claim 15, wherein the said at least one threshold is variable as a function of the said instant k.

17. Method according to claim 16, wherein a predetermined value is assigned to the said variable threshold for each instant k.

18. Method according to claim 16, wherein for each instant k, the value of the said variable threshold is determined by the use of an adaptive algorithm.

19. Method according to claim 18, wherein the said adaptive algorithm is a gradient type algorithm.

20. Method according to claim 19, wherein the said adaptive algorithm is a gradient type algorithm with variable pitch.

21. Method according to claim 18, wherein since the said lattice comprises a plurality of nodes each associated with one of the said states and at a given instant k, the value of the said variable threshold T at an instant (k+1) is determined by the following equation:

$$T(k+1)=T(k)-\mu(M(k)-M_c)$$

where T(k) represents the value of the said variable threshold at the said instant k, $M_c$ is the target number of propagated nodes in the said lattice, M(k) is the number of propagated nodes in the said lattice at instant k, and $\mu$ is a positive constant representing a learning gain.

22. Method according to claim 21, wherein the said learning gain $\mu$ is a function of the said instant k.

23. Method according to claim 1 the said MAP type algorithm belongs to the group consisting of:

MAP type algorithms;

Log-MAP type algorithms; and

Max-Log-MAP type algorithms.

24. The method of claim 1 and further comprising performing said method in a domain belonging to the group consisting of:

symbol detection;

signal coding/decoding;

turbo-decoding;

turbo-detection; and source coding by quantification in lattice.

25. A communication signals receiver comprising means for implementing a MAP (Maximum A Posteriori) type algorithm to determine a likelihood ratio Ax of a set of states X of a lattice at instant k, wherein each of the said states is associated with at least one intermediate variable belonging to the group comprising a so-called "forward" variable and a so-called "backward" variable propagated by the said MAP algorithm and calculated recursively in a direct direction by a first Viterbi decoder and in an indirect direction direction by a second Viterbi decoder respectively at the said instant k with respect to the said lattice, wherein the means for implementing the MAP type algorithm further comprises:

means in the receiver of reducing the number of states selected by the said MAP type algorithm in order to make a calculation of the said likelihood ratio, means in the receiver of calculating said likelihood ratio for the selected states, for at least some non-selected states and said approximate likelihood ratio at least for some non-selected states, means in the receiver for assigning at least one determined value to the corresponding said forward variable calculated by the first Viterbi decoder and/or backward variable calculated by the second Viterbi decoder, so as to calculate an approximate likelihood ratio in the receiver of calculating said approximate likelihood ratio at least for some non-selected states; and wherein at a given instant k, with $0 \leq k \leq K$, said at least one determined value a(k) assigned to said forward variable is smaller than a minimum value of said forward variable at said instant k and/or said at least one determined value b(k) assigned to said backward variable is smaller than a minimum value of said backward variable at said instant k.

* * * * *

UNITED STATES PATENT AND TRADEMARK OFFICE
CERTIFICATE OF CORRECTION

PATENT NO.         : 7,512,868 B2
APPLICATION NO.    : 10/506521
DATED              : March 31, 2009
INVENTOR(S)        : Alexandre Rouxel

It is certified that error appears in the above-identified patent and that said Letters Patent is hereby corrected as shown below:

Column 13
Line 43, delete "$BM(i,j)=ln(b_{ij}(y_k))$" insert -- $BM(i,j)=-ln(b_{ij}(y_k))$ --.

Column 18
Line 64, delete the second occurrence of "direction".

Signed and Sealed this

Twenty-fourth Day of November, 2009

David J. Kappos
*Director of the United States Patent and Trademark Office*